US006993696B1

(12) United States Patent  
Tanizaki et al.

(10) Patent No.: US 6,993,696 B1  
(45) Date of Patent: Jan. 31, 2006

(54) SEMICONDUCTOR MEMORY DEVICE WITH BUILT-IN SELF TEST CIRCUIT OPERATING AT HIGH RATE

(75) Inventors: Tetsushi Tanizaki, Hyogo (JP); Kazushi Sugiura, Hyogo (JP); Masami Nakajima, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 406 days.

(21) Appl. No.: 09/712,246

(22) Filed: Nov. 15, 2000

(30) Foreign Application Priority Data

Nov. 19, 1999 (JP) ................................ 11-329822

(51) Int. Cl.  
*G01R 31/28* (2006.01)  
*G06F 11/00* (2006.01)

(52) U.S. Cl. ...................................... 714/744; 714/731
(58) Field of Classification Search ................ 714/733, 714/724, 719, 718, 744, 731, 702, 700; 324/754; 365/201

See application file for complete search history.

(56) References Cited

U.S. PATENT DOCUMENTS 5,254,942 A * 10/1993 D'Souza et al. ............ 714/727
5,790,564 A * 8/1998 Adams et al. .............. 714/738
5,796,745 A * 8/1998 Adams et al. .............. 714/718
5,974,579 A * 10/1999 Lepejian et al. ............ 714/733
6,223,312 B1 * 4/2001 Nozuyama ................... 714/724
6,249,893 B1 * 6/2001 Rajsuman et al. .......... 714/741

FOREIGN PATENT DOCUMENTS

| JP | 09-007397 | 1/1997 |
| JP | 9-62533 | 3/1997 |
| JP | 10-339765 | 12/1998 |
| JP | 11-329000 | 11/1999 |

* cited by examiner

*Primary Examiner*—Albert Decady  
*Assistant Examiner*—Mujtaba Chaudry  
(74) *Attorney, Agent, or Firm*—McDermott Will & Emery LLP

(57) ABSTRACT

A semiconductor memory device with a built-in self test circuit includes a semiconductor substrate, a memory cell array formed on the semiconductor substrate, an input buffer provided on the semiconductor substrate to receive externally applied data, a test circuit coupled to the memory cell array and the input buffer on the semiconductor substrate to store a program received through the input buffer to generate test data of the memory cell array according to the stored program to carry out testing of the memory cell array, and a select circuit selectively applying to the memory cell array test data applied from the test circuit and data applied from the input buffer depending upon a test operation and a normal operation.

2 Claims, 17 Drawing Sheets

(A) (ALPG) (DUT)
(B) CELL ALL L/H (A) (ALPG) (DUT)
(B) CELL CHECKER (A) (ALPG) (DUT)
(B) CELL ROW STRIPE

SEMICONDUCTOR MEMORY DEVICE WITH BUILT-IN SELF TEST CIRCUIT OPERATING AT HIGH RATE

BACKGROUND OF THE INVENTION

1. Field of the Invention

The present invention relates to semiconductor memory devices, and more particularly to a semiconductor memory device with a built-in self test circuit (referred to as "BIST circuit" hereinafter).

2. Description of the Background Art

A semiconductor memory device includes a memory cell array with a plurality of memory cells. In accordance with microminiaturization of semiconductor memory devices, the size of each memory cell becomes smaller. The possibility is high of a defect being caused by dust and the like during the fabrication process. Also, the interference of data between adjacent cells cannot be ignored in accordance with the microminiaturization of the memories. It is therefore necessary to test the circuit including the memory cells prior to shipment of a semiconductor memory device as a product.

Conventionally, a memory tester (auto test equipment; referred to as "ATE" hereinafter) is used to test a semiconductor memory device. The ATE is an expensive apparatus.

An example of a conventional arrangement in such testing is shown in FIG. 1. Referring to FIG. 1, a memory 220 to be tested is connected to a tester 222. A clock signal is applied to memory 220 via a clock signal line 26 and a clock input pin 36. Input data and address signals are applied to memory 220 via an input line 28. The test result is read out from memory 220 via an input/output pin 40 and an input/output line 24.

Memory 220 includes a memory array 230, an input buffer 242, a control circuit 234, and an input/output circuit 232.

In a test operation, data to be written into a memory cell is applied to memory 220 from tester 222 via input/output lines 24 and input/output pins 40. Also, an address signal and a control signal are applied to control circuit 234 via input lines 28, input pins 38, and input buffers 242. Data is written into the specified address in memory array 230. That data is read out and applied to tester 222 via input/output buffer 248, input/output pins 40 and input/output lines 24. Tester 222 determines the test result.

In this conventional case, a total of nineteen input lines 28 is required when memory array 230 corresponds to 4 megawords×4 banks. More specifically, the nineteen input lines 28 correspond to 13 bits for the address signal, 2 bits for the bank address signal, and 4 bits for input/output control signals (/CS, /RAS, /CAS, /WE). Note that a forward slash "/" before a signal name indicates that the signal is low-active. Also, sixteen input/output lines 24 are required for one 16-bit word. It is to be noted that only four input/output lines 24 are required in the degeneration test that will be described afterwards.

The semiconductor memory device referred to as a DRAM (Dynamic Random Access Memory) has the capacity increased by virtue of development of the recent microminiaturization technique. Since the number of memory cells to be subjected to testing increases, the time required for testing will take longer if the above-described method is employed. Furthermore, it is necessary to carry out testing according to many test patterns since the data retained in the memory cell is influenced by its own value and the value of adjacent memory cells. The number of test patterns increases exponentially with the increase of the number of memory cells. Therefore, the time required for testing also increases significantly. In order to ensure an ATE that can accommodate a longer testing time, a large amount of investment in equipment was required to fabricate a semiconductor memory device.

Conventionally, testing was carried out from the standpoint of the user of the semiconductor memory device to allow a semiconductor memory device to be tested as simply as possible. For example, an ROM (read only memory) in which test patterns are stored is provided in a semiconductor memory device. In a testing operation, data is written into each memory cell according to the test pattern from this ROM to be compared with data that is read out and written (expected value). Testing was carried out in such a way.

Also, in order to reduce the test cost, the inputs/outputs (I/O) are degenerated in a wafer test to provide the same number of measure objects. Here, the meaning of "degeneration" is set forth in the following. The address of a memory cell in a memory cell array is specified for every sub word line. A plurality (for example 4) of subword lines are connected to one main word line. When a defect is found, repair is carried out in the unit of this main word line (replaced with spare cells). Therefore, testing is to be carried out in the unit of this main word line. This means that several bits of the lower order of the address are not required. This is called "degeneration".

The recent semiconductor memory devices have a multi bank structure to read out data speedily. Readout is effected in an interleaving manner. In this readout, a plurality of bits identical in number to the inputs/outputs must be output from each bank. However, the number of inputs/outputs of the semiconductor memory device increases as a result of the increase of the number of bits that can be processed at one time by the computer or the like. As a result, the effect on data caused by interference between input/output data has increased. Therefore, the combination test of input/output data as the testing item is important. However, such testing is difficult with the above-described degeneration test.

The number of patterns estimated for the test pattern is increased in accordance with the microminiaturization and larger capacity of the semiconductor memory device. The capacity of the ROM in which these patterns are stored must also be increased. Thus, there was a problem that the required chip area becomes larger. Also, reduction in the charge margin of the stored data caused by microminiaturization may affect the stored data such as in the case where the ground potential is slightly shifted to the high (H) side. There may be some patterns that are to be particularly tested after the semiconductor memory device has been actually designed and produced. The case where an ROM is employed cannot cope with such a problem.

In view of the foregoing, a test that can be carried out more flexibly is desirable from the standpoint of the manufacturer of a semiconductor memory device. A more flexible test is expected to counterbalance the increase in overhead (for example, a larger chip area), if any, in the semiconductor memory device per se from the overall view of the cycle of designing, fabricating, testing and shipping a semiconductor memory device.

SUMMARY OF THE INVENTION

An object of the present invention is to provide a semiconductor memory device that can suppress investment in equipment for testing with respect to increase in the storage capacity of a semiconductor memory device.

Another object of the present invention is to provide a semiconductor memory device that can carry out testing more flexibly.

A further object of the present invention is to provide a semiconductor memory device that can carry out testing by a desired pattern after fabrication.

Still another object of the present invention is to provide a semiconductor memory device that facilitates testing of input/output combination data of a semiconductor memory device.

According to an aspect of the present invention, a semiconductor memory device with a built-in self test circuit includes a semiconductor substrate, a memory cell array formed on the semiconductor substrate, an input buffer provided on the semiconductor substrate to receive externally applied data, a test circuit coupled to the memory cell array and the input buffer on the semiconductor substrate to store a program received via the input buffer and generate test data of the memory cell array according to the stored program to test the memory cell array, and a select circuit selectively applying to the memory cell array test data applied from the test circuit and data applied from the input buffer according to whether it is a test operation and a normal operation.

By loading and executing an external program for a desired test into the test circuit, the memory cell array can be tested using various memory patterns. As a result, testing is allowed according to a desired pattern even after fabrication of the semiconductor memory device. Testing can be carried out in a more flexible manner.

Preferably, the test circuit includes a rewritable instruction memory provided on the semiconductor substrate to store a program, a test pattern generation circuit coupled to the instruction memory on the semiconductor substrate to generate and apply to the select circuit test data and an instruction and address for testing according to the program stored in the instruction memory to write into each memory cell in the memory cell array, and a controller connected to the input buffer, and operating in response to an externally applied control signal via the input buffer to control writing of the program applied via the input buffer into the instruction memory and the operation of the instruction memory and the test pattern generation circuit in a test operation. The semiconductor memory device further includes a readout circuit connected to the memory cell array and the test circuit, responsive to control by the controller to read out data from a memory cell and providing the data outside the semiconductor memory device.

It is not necessary to supply an external address since the test pattern generation circuit generates an address in a test operation. The number of pins of the semiconductor memory device can be determined independent of the scale of the memory cell array. Therefore, the number of pins required for testing can be reduced.

Further preferably, the test pattern generation circuit, the instruction memory, the memory cell array and the readout circuit operate in synchronization with a frequency-multiplied dock signal which is the operating clock signal of the controller multiplied by a predetermined factor.

More preferably, the test pattern generation circuit, the instruction memory, the memory cell array and the readout circuit can operate in synchronization with the high-speed frequency-multiplied clock signal since these circuits do not carry out input/output with an external source. The time required for testing can be reduced to lower the cost for testing.

The memory cell array includes a plurality of input/output circuits. The data loaded to the test circuit includes input/output combination data to test the plurality of input/output circuits of the memory cell array in addition to the program executed by the test circuit. The readout circuit includes input/output combination test circuits provided corresponding to the plurality of input/output circuits to write test data corresponding to the input/output combination data into the memory cell array via the plurality of input/output circuits to determine whether the data read out from the memory cell array via the input/output circuit is correct or not. The controller stores the program into the test circuit and provides the combination data of the previous output to the plurality of input/output combination test circuits. More preferably, the test circuit can output an expected value master data of one bit for the previous input/output circuit. Each of the plurality of input/output combination test circuits includes a register to store input/output combination data for a corresponding input/output circuit, a write driver circuit taking and writing into the memory cell array the logical operation result between the expected value master data and the input/output combination data stored in the register, and a determination circuit determining whether the output of a corresponding input/output circuit is correct or not by comparing the data read out from the memory cell array via the corresponding input/output circuit with the value obtained by taking the logical operation between the expected value master data and the input/output combination data stored in the register.

According to another aspect of the present invention, a method of executing testing of a memory cell array in a semiconductor memory device with a built-in memory cell array and self test circuit includes the steps of initiating reception of load data including a program defining the test procedure from outside the semiconductor memory device via a predetermined number of pins in response to an externally applied first control signal, sequentially receiving the load data and sequentially storing the same into the instruction memory, suppressing reception and storage of load data in response to encountering information indicating termination of load data in the load data, and responsive to an externally applied second control signal to execute the program included in the instruction memory to generate test pattern data of the memory cell array according to an algorithm realized by the program and testing the memory cell array.

Upon applying the first control signal to initiate loading of the load data, the load data is sequentially received and written into the instruction memory. By placing information indicating termination of load data at the end of the load data, data loading is terminated automatically. Then, by applying the second control signal, testing of the memory cell array is executed according to an algorithm realized by the loaded program. Thus, the test itself can be executed speedily and simply by preparing in advance appropriate load data.

According to a further aspect of the present invention, a method of providing data read out from a memory cell array in synchronization with a first clock signal of a first frequency to an external circuit operating in synchronization with a second clock signal of a second frequency smaller than the first frequency is provided. The ratio of the first frequency to the second frequency is a predetermined positive integer. This method includes the steps of repeating for the positive integer number of times sequential output of the positive integer number of data read out from the memory cell array one by one per one cycle of the first dock signal, and repeating for the positive integer number of times sequential readout of the outputs of the output step for every one data item per one cycle of the clock signal of the second frequency. The timing of reading out data in each cycle of the clock signal of the second frequency is defined by a strobe signal generated one at a time at a timing sequentially shifted by a time interval identical to the cycle of the first clock signal in each cycle of the second clock signal.

In reading out data output from a memory that operates at high speed using an external apparatus of lower speed, the difference in the operating speed may be a problem. In the method of the present invention, sequential output of a data item is repeated for the number of ratios of the frequency. Data is output corresponding to the number of ratios of the frequency per one cycle of the second dock signal whereas data is read out only once per one cycle. However, by repeating readout for the same number of times while sequentially shifting the actual readout timing by the signal frequency of the first signal during each cycle of the second clock signal, all data items can be read out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
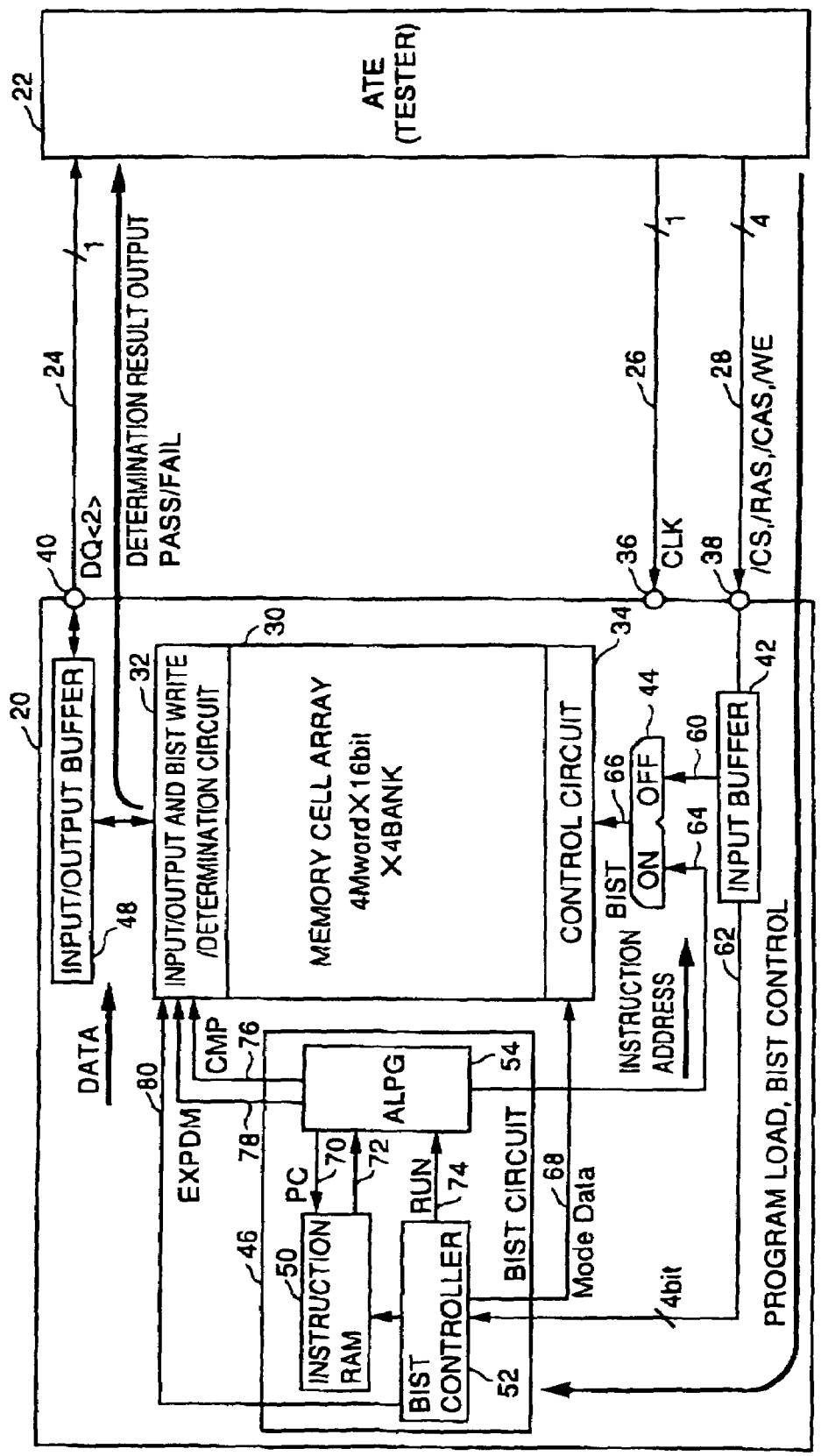
FIG. 2 is a block diagram of a memory 20 with a built-in self test circuit according to a first embodiment of the present invention.

Referring to FIG. 2, a memory 20 with a built-in self test circuit according to a first embodiment of the present invention is connected to a tester 22 through a tester 22 input/output pin 40 and an input/output line 24, a clock input pin 36 and a clock signal line 26, and four input pins 38 and input lines 28.

Memory 20 with a built-in self test circuit includes an input buffer 42, a built-in self test (BIST) circuit 46, a memory cell array 30, a control circuit 34 to control the operation of memory cell array 30, an input/output and BIST write/determination circuit 32 providing data to/from memory cell array 30 and input/output buffer 48 and having the function of determining the result of the self test, and a multiplexer 44 selecting and providing to output 66 to apply to control circuit 34 either the command/address applied from built-in self test (BIST) circuit 46 via a command/ address line 64 or a control signal applied via input buffer 42 according to whether in a self test operation or not, all provided on a common semiconductor substrate.

Built-in self test (BIST) circuit 46 includes a BIST controller 52 to control the self test operation, an instruction RAM 50 storing instruction data and providing onto an instruction input line 72 the instruction of an address specified by a program counter value on a PC line 70, and an ALPG 54 providing on PC line 70 a program counter value which is the address of the instruction to be executed next, and responding to the output program counter value to execute the instruction on instruction input line 72 to provide on command/address line 64 test pattern data for testing memory cell array 30 and command/address data to control memory cell array 30. Instruction RAM 50 is an SRAM (Static Random Access Memory). The self test operation includes program loading to instruction RAM 50, execution of ALPG 54, and output of the result of the self test.

Control of BIST controller 52 is effected by a combination of input lines 28 or the serial input applied via input line 28. For example, program loading is initiated when the signals on input lines 28 attain a particular combination. Once loading of the program data is itiated, BIST controller 52 functions as a load sequencer of the program. No external input for another self test operation will be accepted during this period. Only when the program loading ends can BIST controller 52 attain the former status to allow reception of external input for various self tests. Termination of program loading is effected when a predetermined load termination instruction is found in the loading data.

Figure 3:
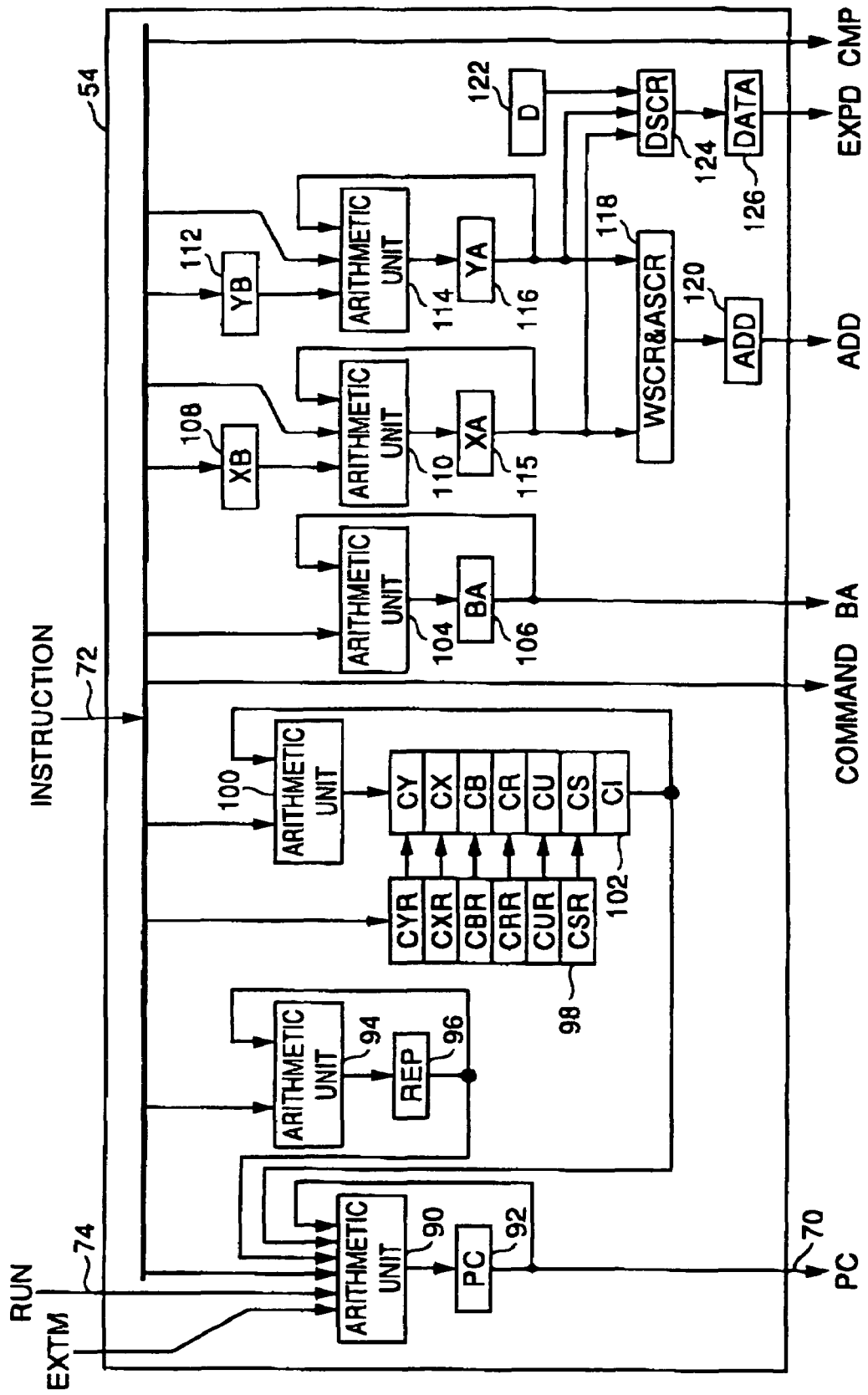
FIG. 3 is a block diagram of an ALPG (ALgorithmic Pattern Generator) 54 of the first embodiment of the present invention.

Referring to FIG. 3, ALPG 54 includes an arithmetic unit 90 to calculate the address of the instruction that is to be executed next, a program counter 92 to store the calculated address, an arithmetic unit 94 to calculate the repeating number of times, a register 96 to store the repeating number of times, an arithmetic unit 100 to carry out operation in conditional branching, general-purpose registers 102 used as counters in repeating, and reload registers 98 storing, when the initial values of general purpose registers 102 are modified, those initial values.

ALPG 54 further includes an arithmetic unit 104 to calculate the bank address of memory cell array 30, a resister 106 storing the bank address, a register 108 storing a first operand in the instruction, an arithmetic unit 110 calculating the logical address in the X direction according to the contents of the instruction and register 108, a register 115 to store the logical address in the X direction, a register 112 to store a second operand of the instruction, an arithmetic unit 114 to calculate the logical address in the Y direction of memory cell array according to the contents of the instruction and register 112, a register 116 to store the output of arithmetic unit 114, an address scrambler 118 to carry out address scramble (including ware scramble) on the addresses in the X and Y directions output from registers 115 and 116, respectively, to allow testing talking into account the internal physical address in memory 20 with a built-in self test circuit, an address register 120 to store the address subjected to address scramble, a register 122 to store the data that becomes the basis of expected value master data, a data scrambler 124 carrying out an operation between the contents of register 122 and the address signal applied from registers 115 and 116 according to the test pattern to generate test data, and a data register 126 to retain the output of the data scrambler 124.

ALPG 54 further has the function to output a command signal and a comparison (CMP) signal according to the contents of the instruction.

Arithmetic unit 100 calculates and stores in general purpose registers 102 condition codes according to the values stored in general purpose registers 102 used as a counter for conditional branching and the instruction. The value of arithmetic unit 100 is applied to arithmetic unit 90 to be used in the calculation of the program counter as will be described afterwards. The initial values of general purpose registers 102 are fixed values. In general, the values return to that initial values after a predetermined counting. Depending upon the test pattern, the initial values of general purpose registers 102 will be the values stored in reload registers 98 by storing the initial values therein.

Arithmetic unit 94 functions to calculate the repeating number of times in the repeating operation. The repeating number of times is stored in register 96. Upon establishment of a predetermined jump condition, a condition code signal thereof is applied from arithmetic unit 94 to arithmetic unit 90.

Arithmetic unit 90 initiates its operation upon reception of an execution signal RUN from a RUN signal line 74 to calculate and output the address of the next instruction according to the contents of the instruction applied from instruction input line 72, the status of an external signal EXTM, the condition code applied from arithmetic unit 100, the repeating condition code applied from arithmetic unit 94, and the value of program counter 92. The output value is stored in program counter 92.

Figure 4:
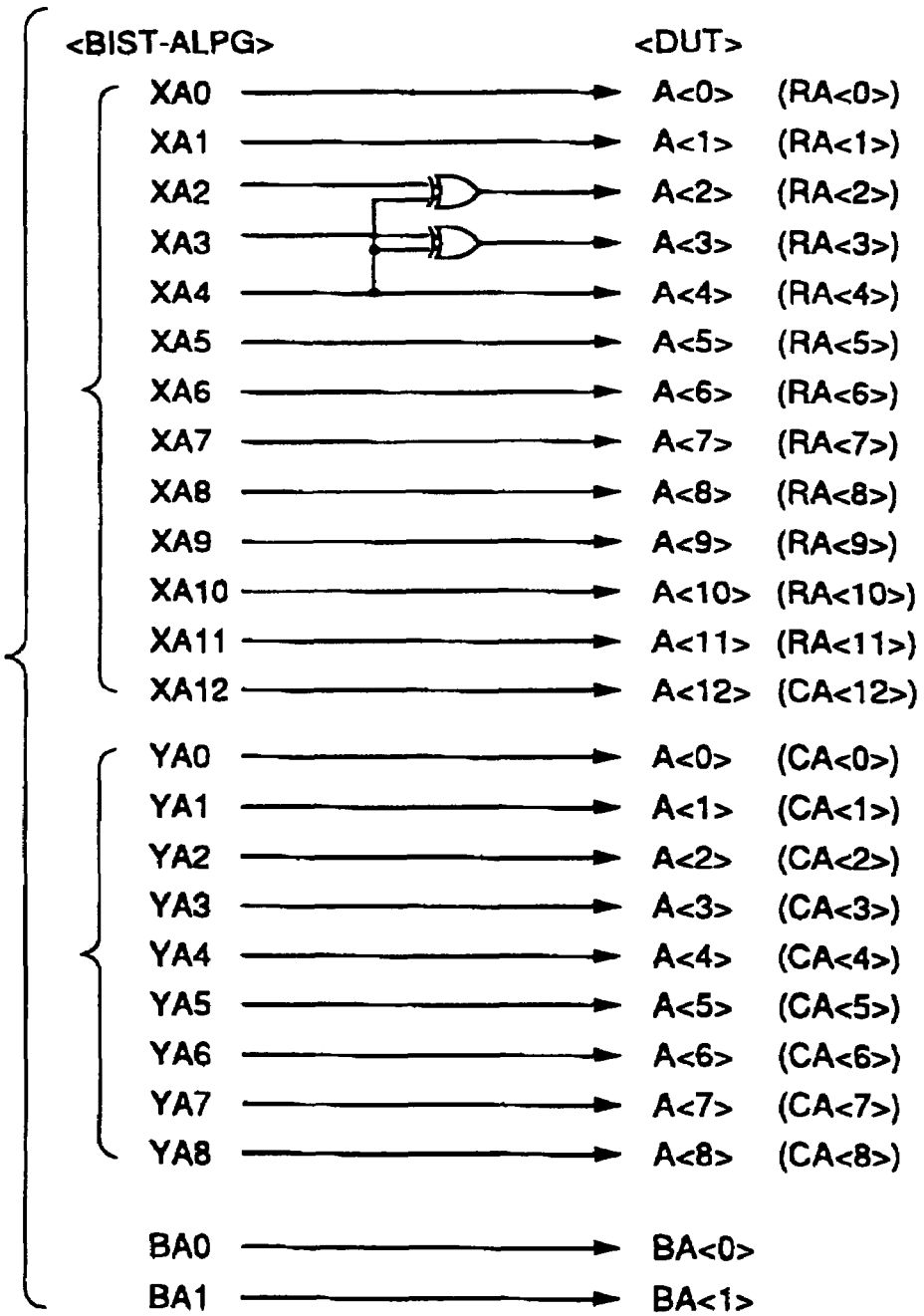
FIG. 4 is a diagram to describe an address scramble function of the first embodiment.

Address scrambler 118 functions to carry out the address scramble of the DRAM. The meaning of "address scramble" is set forth in the following. The storing position in the memory is specified by an address. However, an externally applied logical address does not necessarily match the physical address of the storing position corresponding to that logical address in the memory. For example, there is the case where addresses that are logically continuous reside at sites apart from each other in the memory due to restriction in the layout of the circuit in the memory. In this case, the externally applied address must be converted into an address corresponding to the actual address in the memory. This is "address scramble". Address conversion carried out in this address scramble depends on each design, i.e., on each product. FIG. 4 shows an example of a logic circuit for address conversion carried out by address scrambler 118.

Among addresses XA0–XA12 applied to address scrambler 118 in the example of FIG. 4, XA2 and XA4 are exclusive-ORed and also XA3 and XA4 are exclusive-ORed to be output as address A<2> and address A<3>, respectively.

Figure 5:
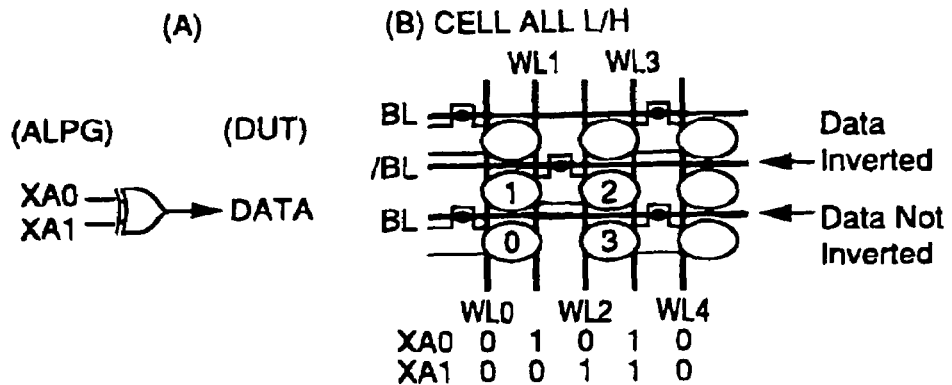
FIGS. 5, 6 and 7 are diagrams to describe a data scramble function of the first embodiment.
Figure 6:
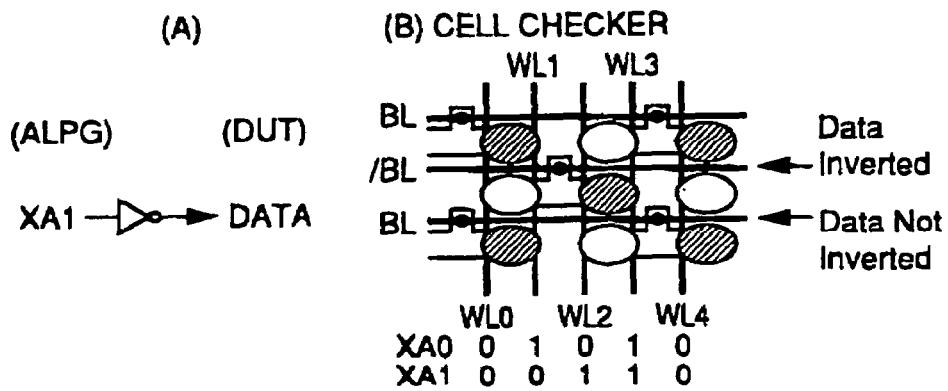
Figure 7:
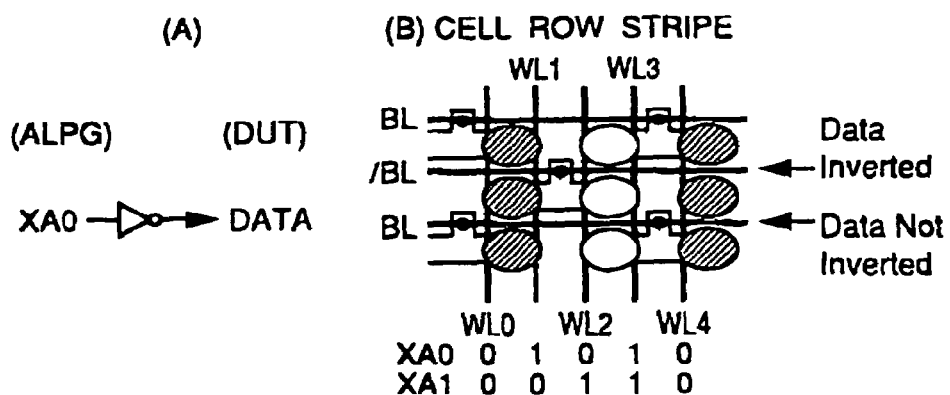

Examples of the data scramble carried out by data scrambler 124 are shown in FIGS. 5–7. Data scrambler 124 functions to generate test pattern data by applying logical operation on some of the input address signals. For example, consider the case shown in FIG. 5(B) where data scrambler 124 has the arrangement of a bit line BL and a bit line /BL (here, "/" represents inversion; a value of inverted data is applied), and memory cells connected to each of word lines are connected to the bit lines alternately. Focusing on the least significant two bits of the address signals, the order to the memory cells specified by this address is as indicated by the numeral in each cell of FIG. 5(B).

Thus, by exclusive-ORing the least significant two bits XA0 and XA1 of the address signal as shown in FIG. 5(A), a low value is stored in all the cells as shown in FIG. 5(B). If these data are inverted, a high value will be stored in all the cells.

When a version of the address signal having one bit XA1 inverted as shown in FIG. 6(A) is employed as the data signal, a checkered data array called "cell checker" as shown in FIG. 6(B) is obtained. When a version of the address signal having one bit XAO inverted is employed as the data signal as shown in FIG. 7(A), a data array called "cell row stripe" as shown is FIG. 7(B) is obtained.

Data scrambler 124 includes a plurality of logic circuits that carries out such various logic operations. Data scrambler 124 functions to select and provide to data register 124 the output of a corresponding logic circuit upon receiving the specification of which process is to be carried out for data scramble.

The contents of the structure of load data for built-in self sest (BIST) circuit 46 applied to input buffer 42 from tester 22 via input line 28 and input pin 38 will be described with reference to FIG. 8. In built-in self test (BIST) circuit 46, the length of one word (one instruction) of ALPG 54 is 32 bits. Since there are only four signal lines for input line 28, each word of the load data is applied to memory 20 with a built-in self test circuit 4 bits at a time divided over a plurality of times.

Figure 8:
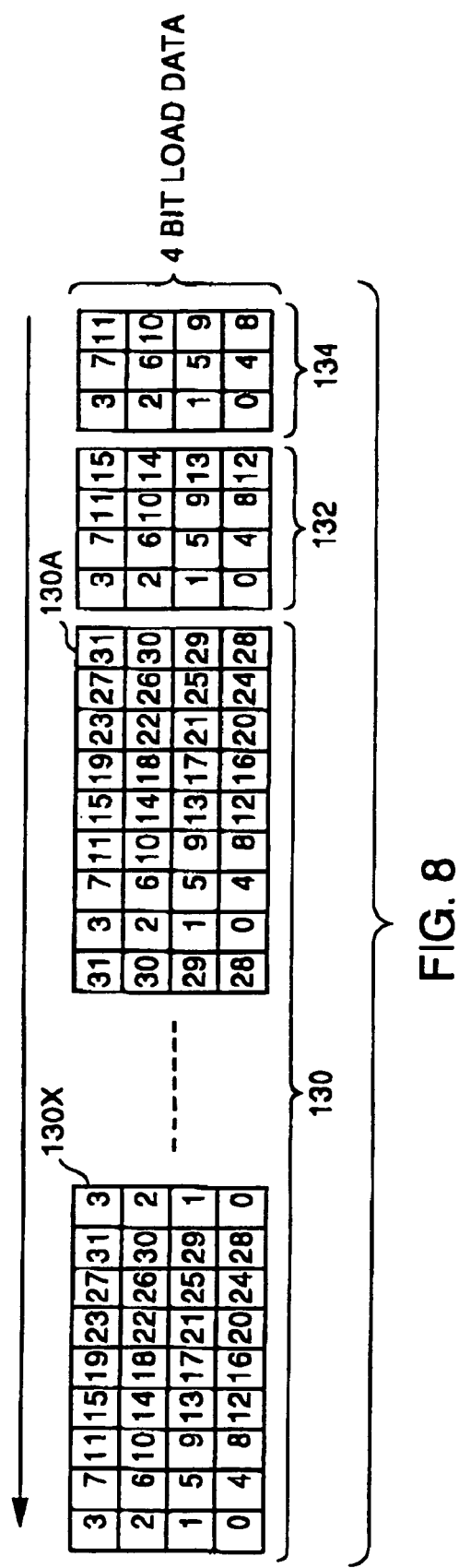
FIG. 8 is a schematic diagram of a structure of instruction data input to the ALPG.

As shown in FIG. 8, the load data includes a plurality of instruction data 130 (130A–130X), input/output combination data 132, and mode data 134. These data are received at input buffer 42, and applied to BIST controller 52 via a program load-BIST control line 62. BIST controller 52 stores instruction data 130 in instruction RAM 50, and other data in respective predetermined registers. In the apparatus of the present embodiment, instruction data 130 corresponds to a plurality of 32-bit words. Input/output combination data 132 corresponds to 16 bits. Mode data 134 corresponds to 12 bits.

Mode data specifies the operation mode of the DRAM device. For a SDRAM device, the mode data includes a value of a mode register not shown test mode data to facilitate testing, data indicating which mode to be actuated in reset, the burst length, and the like.

Figure 9:
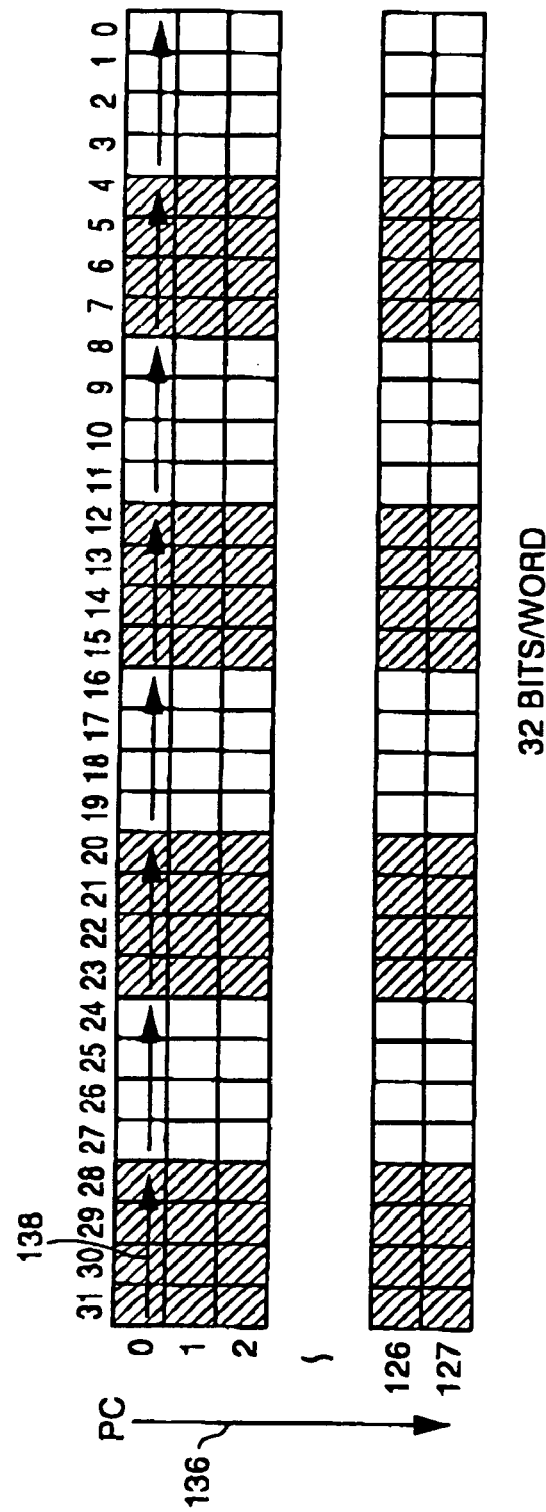
FIG. 9 is a diagram showing a structure of instruction data stored in an instruction RAM.

Referring to FIG. 9, the instruction data divided for every 4 bits applied from tester 22 is stored as set forth in the following in instruction RAM 50. More specifically, the instruction data divided for every four bits to be input is stored sequentially in instruction RAM 50 according to the direction indicated by arrow 138 in FIG. 9. When 32 bits corresponding to the length of one instruction is stored in instruction RAM 50, the instruction address is advanced by 1, and data is stored in a similar manner. The address of the instruction executed by ALPG 54 is specified by the value of the program counter (PC) along the direction indicated by arrow 136.

ALPG 54 generates a data pattern according to an algorithm. There is the case where a conditional branch operation is generated to carry out a repeating operation in the program sequence. In this case, the conditional branch operation is effected by a conditional jump instruction. If this conditional jump instruction is to be carried out in one clock cycle, the condition must be determined during one clock cycle and fetch the instruction of the address of the jump destination from instruction RAM 50. In this case, the interface between ALPG 54 and instruction RAM 50 becomes complicated. Also, circuit designing becomes difficult since high speed operation is sought. In the apparatus of the present embodiment, the delayed jump process of carrying out the jump operation at the next program step of the condition determination is employed as indicated by the jump instruction "JMP" shown at PC=15 in the program list of FIG. 10.

Figure 10:
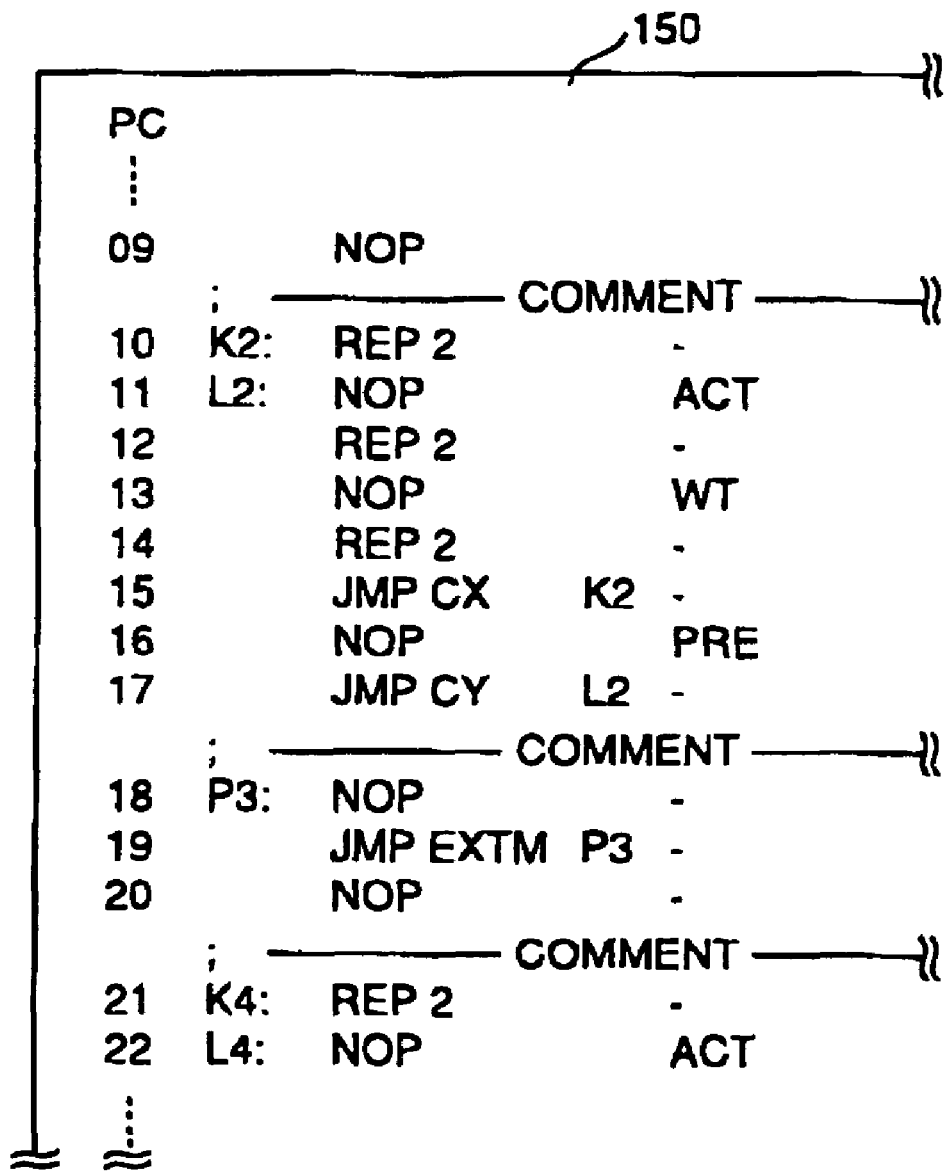
FIG. 10 shows a program to describe a delayed jump in a conditional jump instruction of the first embodiment.
Figure 11:
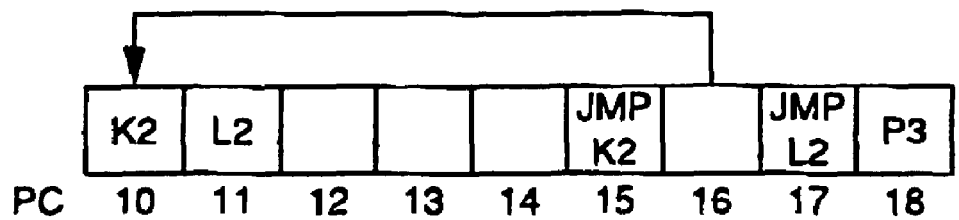
FIG. 11 shows the relationship between the value of a program counter and the shift of the instruction address to describe delayed jump in a conditional jump instruction of the first embodiment.
Figure 12:
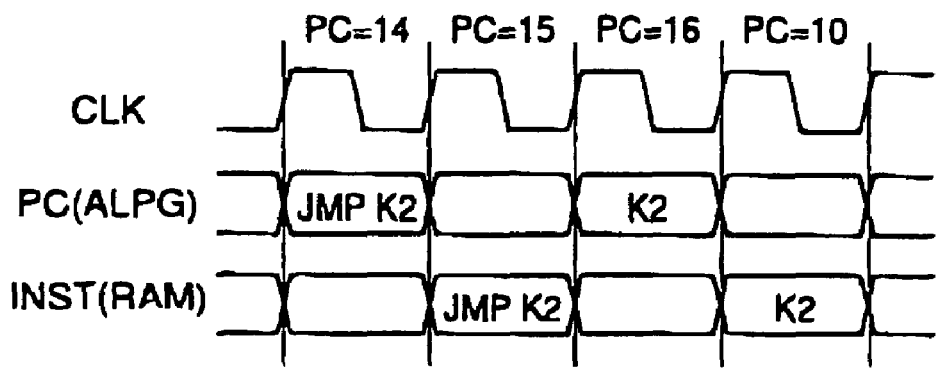
FIG. 12 is a waveform diagram representing the timing in delayed jumping of the conditional jump instruction of the first embodiment.
Figure 13:
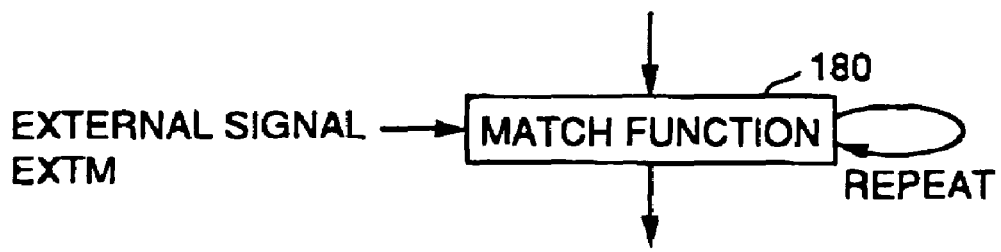
FIG. 13 is a diagram to describe a match function by an external signal employed in the first embodiment FIG. 14 schematically shows the relationship of dock signals supplied to each block of a built-in self test (BIST) circuit 46 of the first embodiment.

FIG. 10 shows that, by the jump instruction of PC=15, control proceeds to PC=17 when register CX=0, otherwise to the address (=10) of PC=label K2. In this case, the address (10) of the jump destination is output at PC=16 as shown in FIG. 12. Therefore, the jump to PC=10 is only executed at the cycle (PC=16) one clock cycle behind the clock cycle (PC=15) where execution of the conditional jump instruction has been effected as shown in FIG. 11.

It is not necessary to carry out the instruction fetch from instruction RAM 50 at high speed by employing this delayed jump process. This provides the advantage that the circuit structure is simplified to facilitate implementation of a memory 20 with a built-in self test circuit.

Arithmetic unit 90 shown in FIG. 3 has a match function to receive external signal EXTM to control the conditional jump instruction by this signal EXTM. An example of this instruction is shown by PC=19 in FIG. 10. The condition of "EXTM" is specified for this instruction "JMP" as shown in FIG. 10. In this case, arithmetic unit 90 controls the jump destination according to the value of the external signal EXTM. Therefore, the repeat can be controlled externally by signal EXTM. When control is effected of repeating the execution of a program by an external signal EXTM, it is not necessary to provide a register to retain the data corresponding to that signal in the circuit. Therefore, the penalty can be reduced by provision of such a function.

Figure 14:
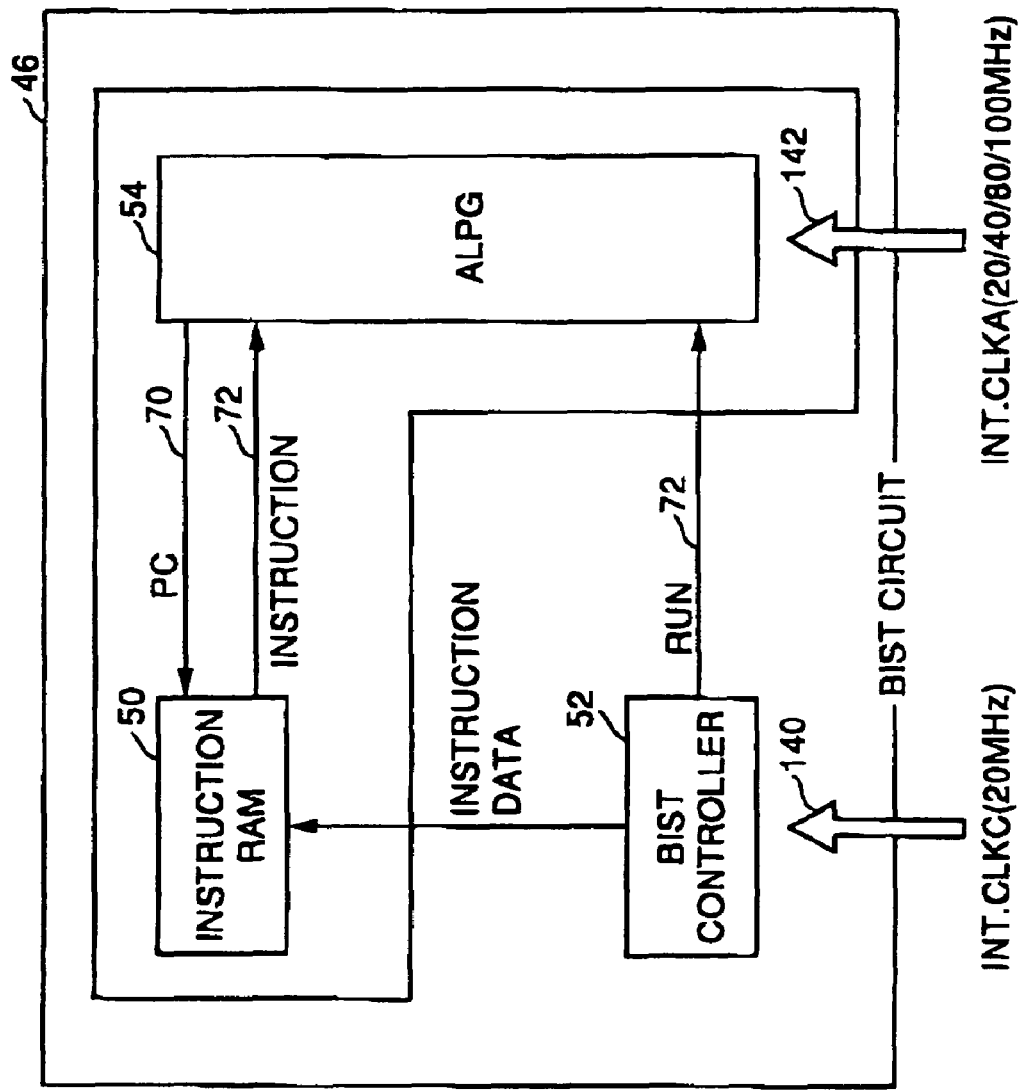

The relationship of the clock signals supplied to each functional block (instruction RAM 50, BIST controller 52 and ALPG 54) in built-in self test (BIST) circuit 46 will be described with reference to FIG. 14. An internal clock signal 140 is supplied to BIST controller 52. An internal frequency-multiplied clock signal 142 is applied to instruction RAM 50 and ALPG 54. Internal frequency-multiplied clock signal 142 is equal in phase with internal clock signal 140, and has a frequency equal to or multiplied by an integer of internal clock signal 140. Internal frequency-multiplied clock signal 142 is generated by multiplying the frequency of internal dock signal 140 using a PLL (Phase Lock Loop; not shown) in memory 20 with a built-in self test circuit.

The usage of internal frequency-multiplied clock signal 142 allows the execution of testing at high speed in built-in self test (BIST) circuit 46 even if the clock signal supplied from tester 22 is of low speed.

Figure 15:
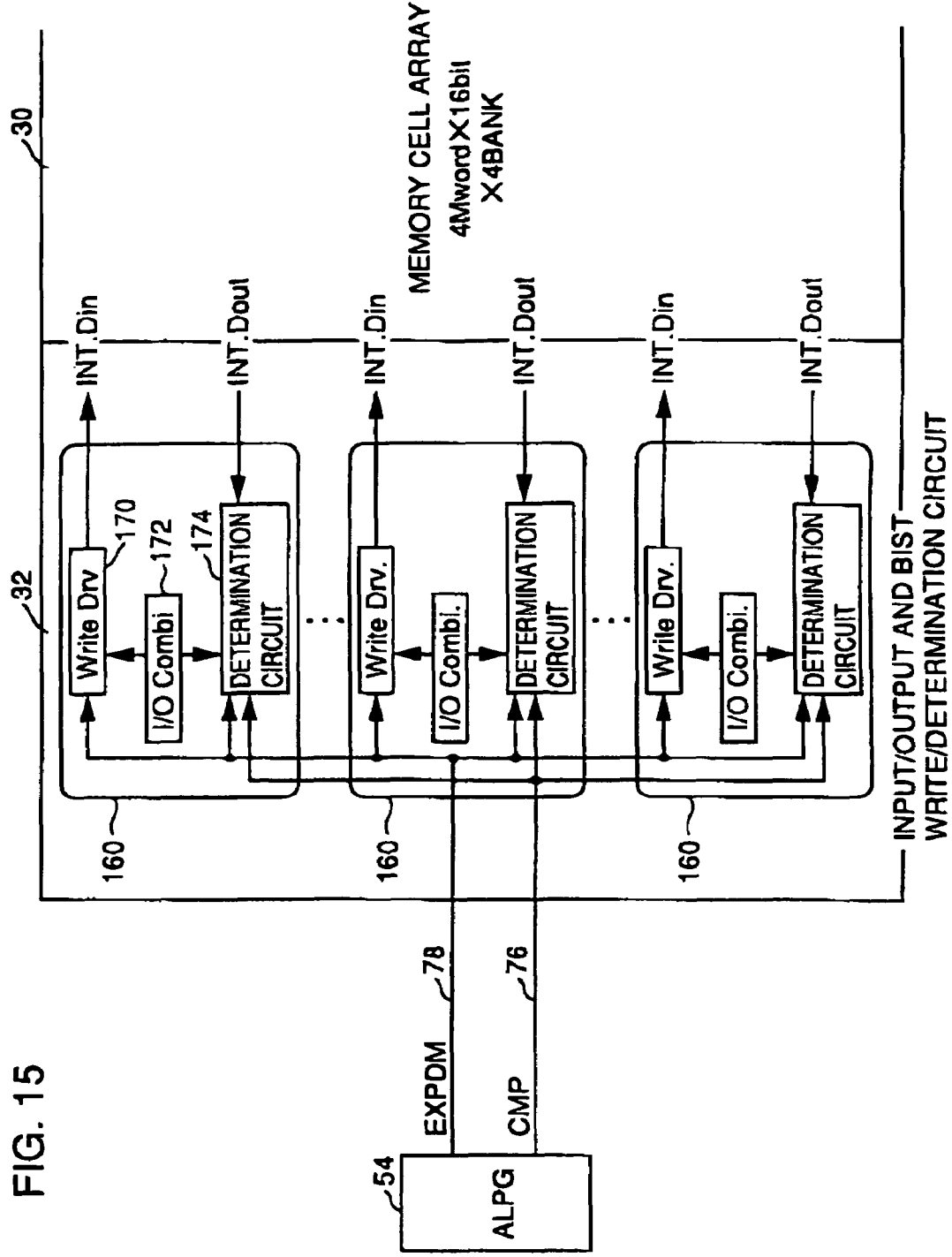
FIG. 15 is a block diagram showing a structure of an input/output and BIST write/determination circuit of the first embodiment.

Referring to FIG. 15, input/output and BIST write/determination circuit 32 includes a plurality of input/output circuits 160 corresponding to the number of inputs/outputs.

Each input/output circuit 160 includes an input/output combination data register 172 to store input/output combination data 132 shown in FIG. 8, a write driver 170 carrying out a certain logic operation between the expected value data master signal generated by ALPG 54 and applied through an EXPDM signal line 78 and the data in input/output combination data register 172 to write into the input/output circuit in memory cell array, and a determination circuit 174 to determine whether the output value is correct or not by comparing the determination expected value corresponding to the logic operation between the master signal of the expected value data applied from ALPG 54 through EXPDM signal line 78 and the data in input/output combination data register 172 with the output from the input/output circuit in memory cell array 30 similarly in a write operation.

According to the above structure, input/output and BIST write/determination circuit 32 can be controlled by the two signal lines of EXPDM signal line 78 from ALPG 54 and CMP signal line 76. This number is the same even if the number of input/output circuits 160, i.e. the number of inputs/outputs from memory cell array 30 increases.

The determined result of determination circuit 174 in each input/output circuit 160 is summarized into a pass/fail result of one bit (not shown) by a wired OR to be output via input/output buffer 48 according to an output instruction of the determination result.

The output of the pass/fail result summarized into one bit output from input/output pin 40 to tester 22 will be described with reference to FIG. 16. Some testers 22 available at a low cost have only one, not two, of the upper and lower levels (the threshold voltage for determination) in detecting the level of the determination signal. When load is not applied to the pin that outputs the determination result in a DUT (Device Under Test) board (performance board to which the device to be tested is attached in the test operation, there is a possibility that the proper determination result (pass/fail) cannot be read out.

Figure 16:
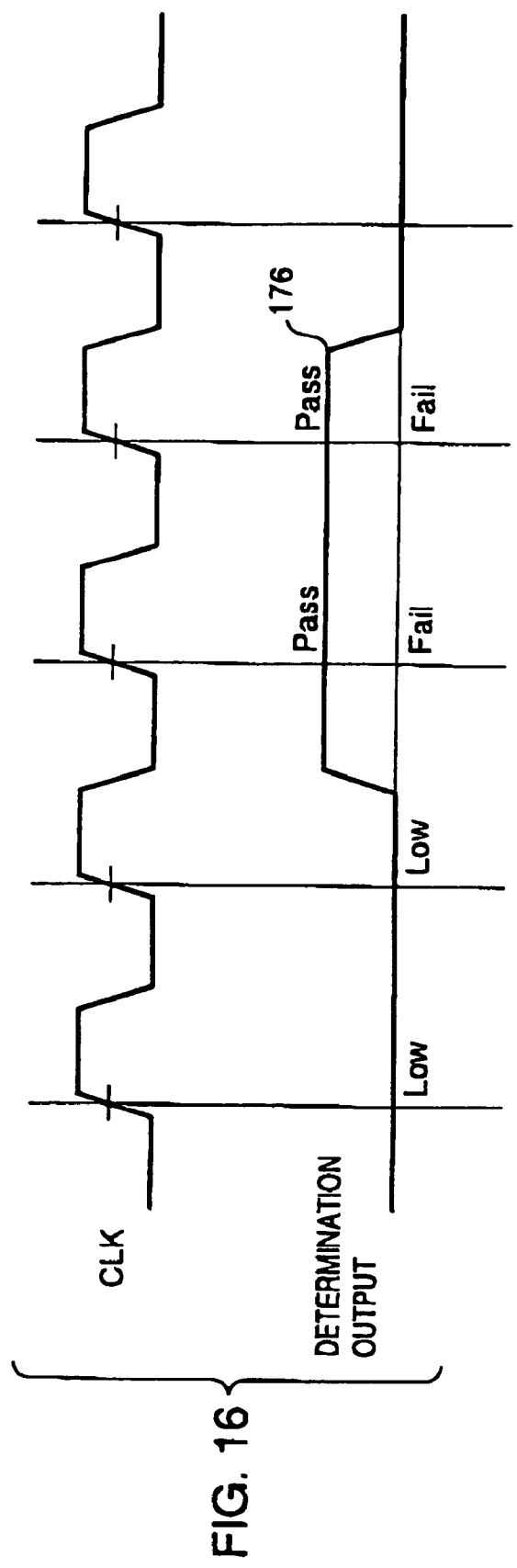
FIG. 16 is a timing chart representing a determination output waveform of the first embodiment.

In the apparatus of the first embodiment, the determination result (pass/fail) of the self test is output after a signal of a fail status (a signal of a low level) is output as shown in FIG. 16. This is advantageous because even if the previous determination result indicates "pass" (high), the charge on the signal line from which the determination result is output is discharged to reliably attain a low level. When the next determination result is "fail" (low), the possibility of erroneous determination of a high level (pass) caused by the remaining charge of the previous determination result is reduced. Thus, testing can be carried out with high reliability even in the case where an economic tester that can set only one level for the determination threshold is used.

In the apparatus of the first embodiment, the signal of the determination result (pass/fail) is output over a plurality of clock cycles as shown in FIG. 16. This provides the advantage that the tester 22 can read out the determination signal at an arbitrary time point during the output of the pass/fail signal.

Figure 1:
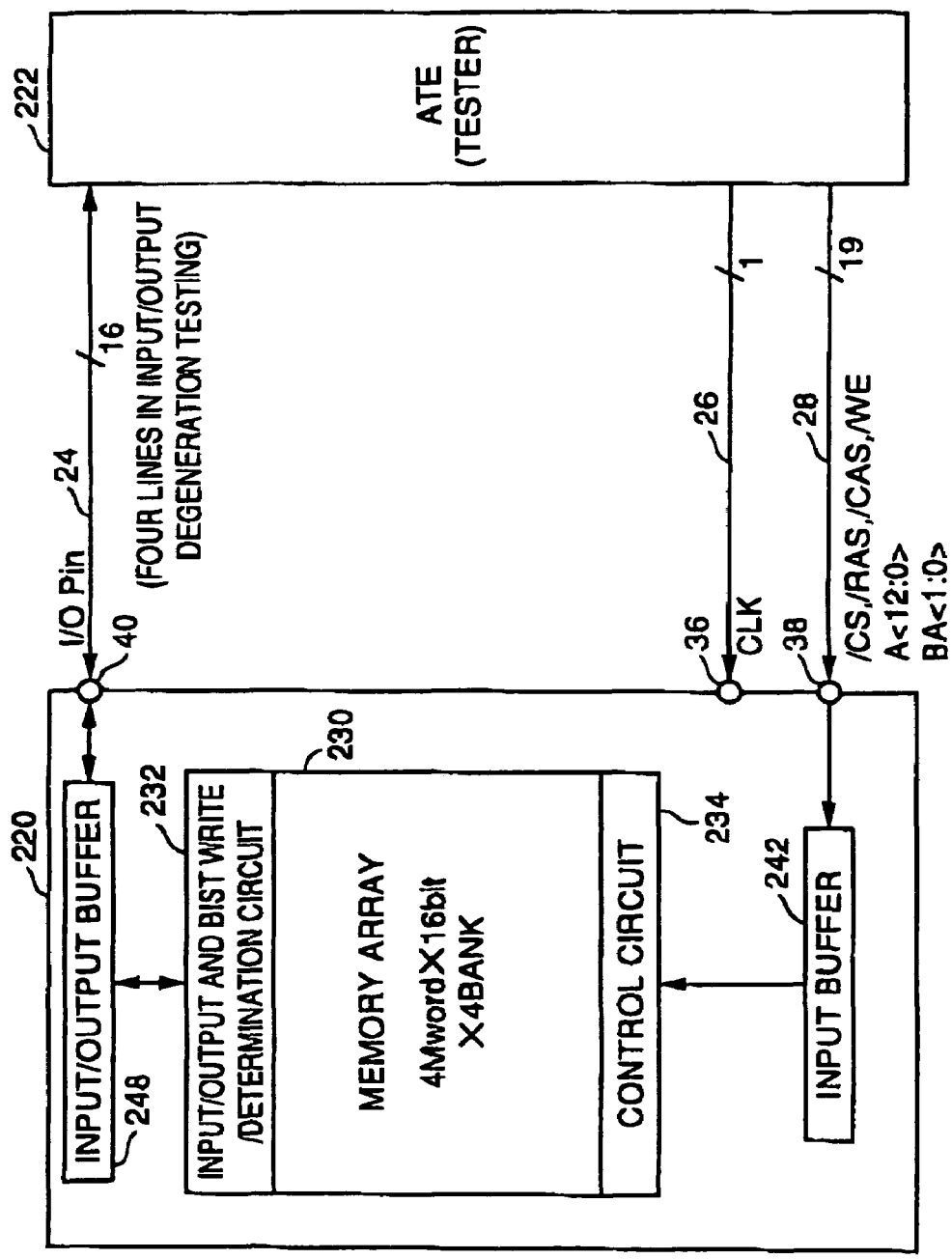
FIG. 1 is a block diagram showing a structure of a conventional memory.

In the apparatus of the first embodiment, the total number of pins required for testing is 6 (four for input line 28, one for clock signal line 26, and one for input/output line 24). It is appreciated that the number of pins required for testing is significantly reduced in comparison to the conventional case shown in FIG. 1 where the required number of pins was 24 even if degenerated.

The operation of the apparatus of the first embodiment will be described schematically hereinafter. In a normal operation, multiplexer 44 provides the control signal applied from input buffer 42 at its output 62. The signals are applied to control circuit 34. In a write operation, the data applied from an external circuit via input/output pin 40 is provided to input/output and BIST write/determination circuit 32 through input/output buffer 48 and written into the specified address in memory cell array 30. In a read out operation, the data read out from memory cell array 30 is applied outside via input/output buffer 48 and input/output pin 40. Therefore, memory 20 with a built-in self test circuit operates as a normal memory in a normal operation.

In a test operation, load data such as the program for ALPG 54 (refer to FIG. 8) is applied 4 bits at a time to memory 20 with a built-in self test circuit from tester 22 via input line 28. Input buffer 42 applies this data to built-in self test (BIST) circuit 42 through program load•BIST control line 62. Built-in self test (BIST) circuit 42 applies instruction data 130 to instruction RAM 50, and input/output combination data 132 to input/output and BIST write/determination circuit 32 through input/output combination data line 80 to be stored in input/output combination data register 172 in input/output and BIST write/determination circuit 32. Mode data 134 is stored in a mode register (not shown) that controls each mode in the control circuit via a mode data line 68. The instruction data 130 of instruction RAM 50 are stored as shown in FIG. 9. The sequence of the program data loading is controlled by BIST controller 52. BIST controller 52 does not accept any external input during this period. When a predetermined load termination instruction is encountered in the load data, BIST controller 52 terminates the load task to allow acceptance of external input. When loading of the required data is completed, testing by built-in self test (BIST) circuit 46 can be carried out.

Upon initiation of testing in response to an execution signal RUN on RUN signal line 74, ALPG 54 outputs the value of program counter 92 on PC line 70 in synchronization with a dock signal. Instruction RAM 50 outputs the instruction stored in this address on instruction input line 72.

ALPG 54 carries out a process according to the fetched instruction. The command/address output from ALPG 54 is applied to multiplexer 44. Multiplexer 44 applies the command/address to control circuit 34 to carry out a write operation similar to that of a normal operation. The same applies for read out. The command/address is applied to control circuit 34, whereby data is read out from memory cell array 30 and applied to input/output and BIST write/determination circuit 32. ALPG 54 applies master data EXPDM of the expected value via EXPDM signal line 78 and determination control signal CMP via CMP signal line 76 with respect to input/output and BIST write/determination circuit 32. Input/output and BIST write/determination circuit 32 carries out pass/fail determination of memory cell array 30 according to the applied data.

In an input/output combination test, a predetermined logic operation is carried out between the combination data pre-stored in input/output combination data register 172 and the expected value master data EXPDM on EXPDM signal line 78 to be applied to memory cell array 30. The value read out from memory cell array 30 is compared with the result of the logic operation carried out between expected value master data EXPDM and the combination data stored in input/output combination data register 172. Determination circuit 174 determines whether they match or not.

As a result of testing carried out according to various test patterns and input/output combination data with respect to memory cell array 30, pass/fail determination is effected. By applying an output instruction of the determination result from tester 22 to BIST controller 52, BIST controller 52 controls the entire device to output the determination result. The determination result is applied from input/output and BIST write/determination circuit 32 to tester 22 via input/output buffer 48, input/output pin 40 and input/output line 24.

Tester 22 refers to this result to identify the result of self testing associated with the pass/fail status of memory 20 with a built-in self test circuit. As previously described with reference to FIG. 16, memory 20 with a built-in self test circuit first renders the output low, and then provides the pass/fail determination result. Therefore, the level of the determination result signal will not be affected by the result of the prior test. Determination can be carried out correctly even by an ATE that can specify only one threshold voltage for the determination of the level of the determination resultant signal. Since the output of the pass/fail signal is carried out continuously over a plurality of cycles, tester 22 can identify the result of the self test at an arbitrary time point.

A semiconductor memory device with a built-in self test circuit according to a second embodiment of the present invention will be described with reference to FIG. 17. A memory 180 with a built-in self test circuit of the second embodiment is directed to facilitate the repair test. Generally in a repair test, a defective address must be detected and stored for the determination of which defective memory cell should be replaced with which redundant memory cell. For this purpose, a memory called a file memory to store the determination result for each address is incorporated in the ATE. In the apparatus of the previous first embodiment, only the pass/fail result of memory 20 with a built-in self test circuit is output. The apparatus of the first embodiment cannot accommodate the repair test. The apparatus of the second embodiment allows such repair testing.

Figure 17:
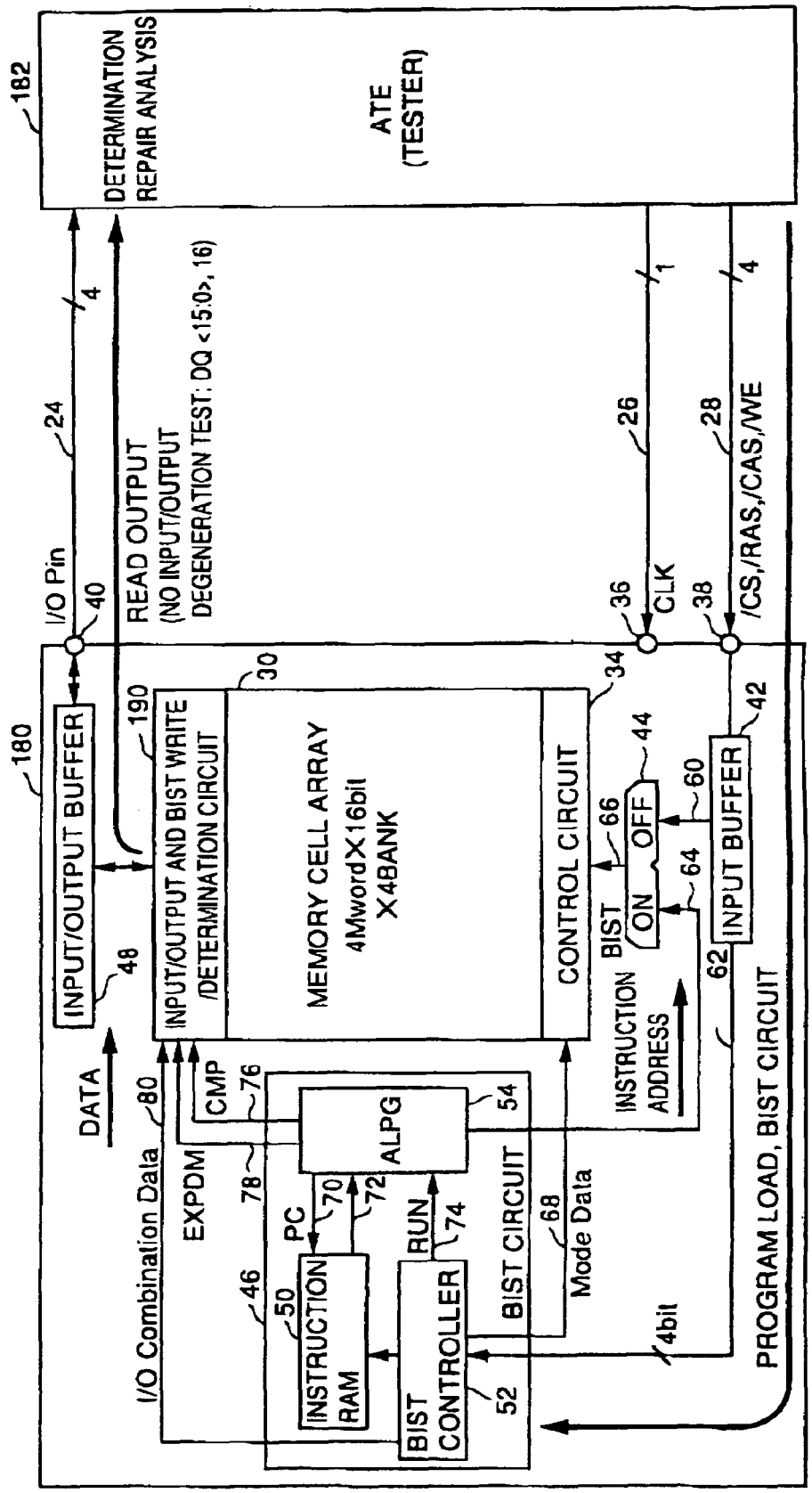
FIG. 17 is a block diagram of a memory 180 with a built-in self test circuit according to a second embodiment of the present invention.

Referring to FIG. 17, memory 180 with a built-in self test circuit differs from memory 20 with a built-in self test circuit of the first embodiment in that test data written into memory cell array 130 is applied to a tester 182 incorporated with the aforementioned file memory through input/output and BIST write/determination circuit 190, input/output buffer 48 and input/output pin 40. In FIG. 17, components corresponding to those of FIG. 2 have the same reference characters allotted. Their names and functions are identical. Therefore, detailed description thereof will not be repeated here.

Similar to memory 20 with a built-in self test circuit of the first embodiment, memory 180 with a built-in self test circuit of the second embodiment loads the program for generating the test pattern from tester 182 into instruction RAM 50. ALPG 54 generates the command, address and write data, whereby test data is written into memory cell array 30. In a read out operation, the command and data are generated at ALPG 54 and applied to controller circuit 34 from output 66 via multiplexer 44, similar to the write operation. Thus, corresponding data is read out from memory cell array 30. The data is applied to tester 182 similar to the read out of a normal memory via input/output and BIST write/determination circuit 190, input/output buffer 48, input/output pin 40 and input/output line 24.

According to the above-described structure, tester 182 can carry out pass/fail determination and repair analysis of memory 180 with a built-in self test circuit in a manner similar to that of the conventional case. It is to be noted that since the row address and column address are degenerated in the repair test in a DRAM device, the number of required inputs/outputs is reduced. For example, in a device of sixteen I/Os, the repair test can be carried out by four I/Os by I/O degeneration.

The apparatus of the second embodiment allows testing to be carried out using a relatively economic ATE. Since a test pattern can be generated according to the program stored in instruction RAM 50 and the program stored in instruction RAM 50 can be applied to memory 180 with a built-in self test circuit from tester 182 via input line 28 and input pin 38 by ALPG 54, testing can be carried out readily with the required test pattern even after fabrication of a product. Testing can be carried out flexibly.

In the apparatus of the second embodiment, the total number of pins required for testing is 9 (four for input line 28, one for clock signal line 26 and four for input/output line 24 by degeneration). It is appreciated that the number of pins required for testing is reduced significantly in comparison to the conventional case shown in FIG. 1 where 24 pins were required even when degenerated.

The data read out from memory cell array 30 is output to tester 182 via input/output and BIST write/determination circuit 190 and input/output buffer 48. In a similar manner, expected value master data EXPDM on EXPDM signal line 78 can be output to tester 182 via input/output and BIST write/determination circuit 190 and input/output buffer 48. In this case, the data generated by ALPG 54 can be monitored by tester 182. Therefore, reliability and efficiency of the test can be improved.

Figure 18:
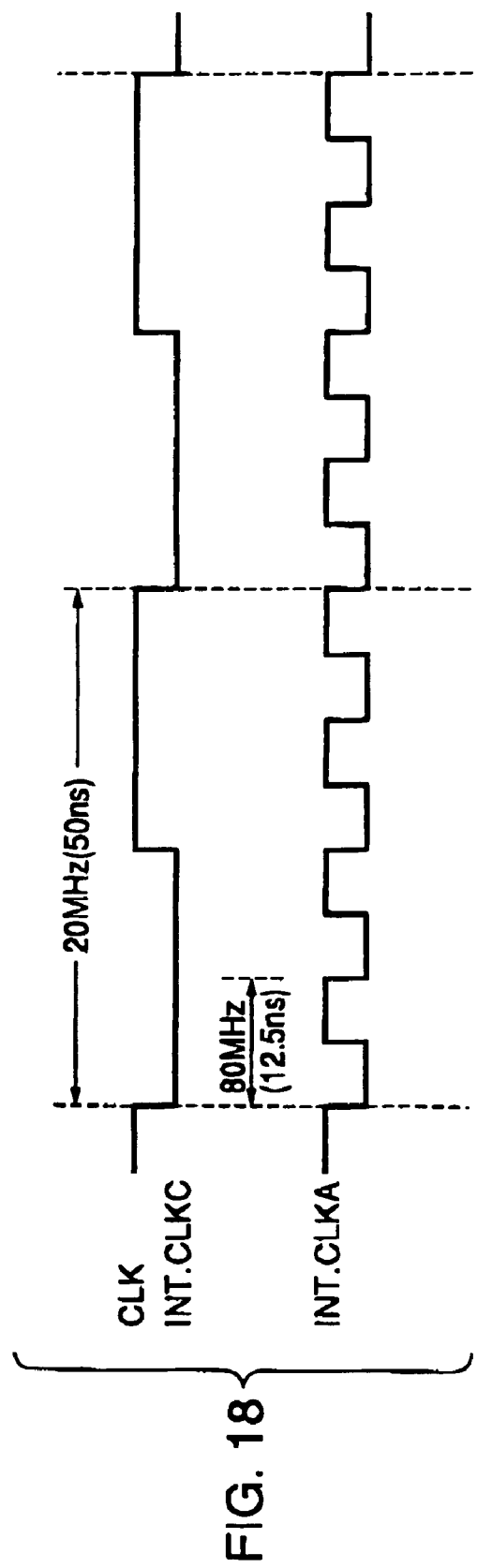
FIG. 18 is a waveform diagram representing the relationship between an internal clock signal and an internal frequency-multiplied clock signal of the second embodiment.

When a frequency-multiplied clock signal is employed as the internal operating dock signal in the apparatus of the second embodiment, the data output from input/output pin 40 is provided at a timing determined by this internal frequency-multiplied clock signal, and tester 182 will operate according to the clock signal prior to being frequency-multiplied. This means that read out cannot be effected at the normal timing when tester 182 reads out the test result. For example, the dock signal by which tester 182 operates is 20 MHz whereas the internal frequency-multiplied clock signal in memory 180 with a built-in self test circuit is 80 MHz as shown in FIG. 18.

Writing data from ALPG 54 into memory cell array 30 is executed according to an internal frequency-multiplied clock signal. Therefore, the process can be carried out at high speed since tester 182 is not involved.

In receiving read out data at tester 182, tester 182 outputs a strobe signal once for one cycle of the clock signal that defines its own operating timing. Data determination can be effected by the timing defined by this strobe signal. It is to be noted that the output timing of the strobe signal has a frequency extremely lower than that of the clock signal that defines the operating timing in memory 180 with a built-in self test circuit. The need arises for some means so that the read out data appears at input/output pin 40 as if of a frequency identical to that of the dock signal of tester 182 from the tester side.

The apparatus of the second embodiment takes advantage that a normal ATE can shift the timing of the strobe signal within one cycle. More specifically, although data is output four times from memory 180 with a built-in self test circuit during one cycle of the operating clock signal of tester 182, determination of only one data thereof is carried out in one cycle. Determination of all the four output data is effected over four cycles by shifting the timing of the strobe signal for every ¼ cycle.

Figure 19:
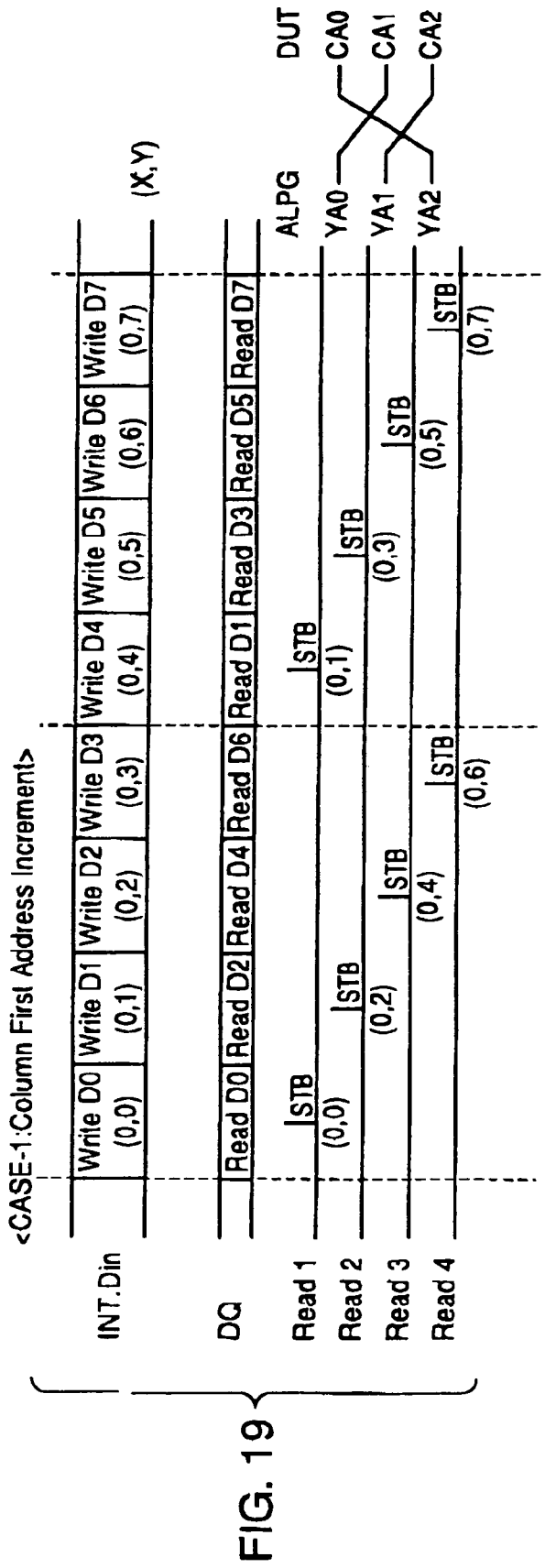
FIG. 19 is a timing chart representing the read out timing of the test result when the column is given priority in the second embodiment.

In practice, the read out sequence must be altered in relationship with the burst length in any event whether writing is effected by column priority address increment or row priority address increment. Therefore, address scramble is applied only in a read out operation. In the example shown in FIG. 19, address scramble is applied among addresses YA0–YA2 in the Y direction output from ALPG 54 to obtain column addresses CA0–CA2 of the DUT. Accordingly, the sequence of read out data D0, D2, D4, D6, D1, D3, D5 and D7 appear four times during eight cycles of tester 182. In the first two cycles, D0 and D1 can be read out by placing the read out strobe between the first ¼ cycle. At the next two cycles, the read out strobe is shifted behind by ¼ cycle to read out D2 and D3. By shifting the strobe in a similar manner thereafter, D4 and D5 are determined at the third cycle and D6 and D7 are determined at the fourth cycle.

Figure 20:
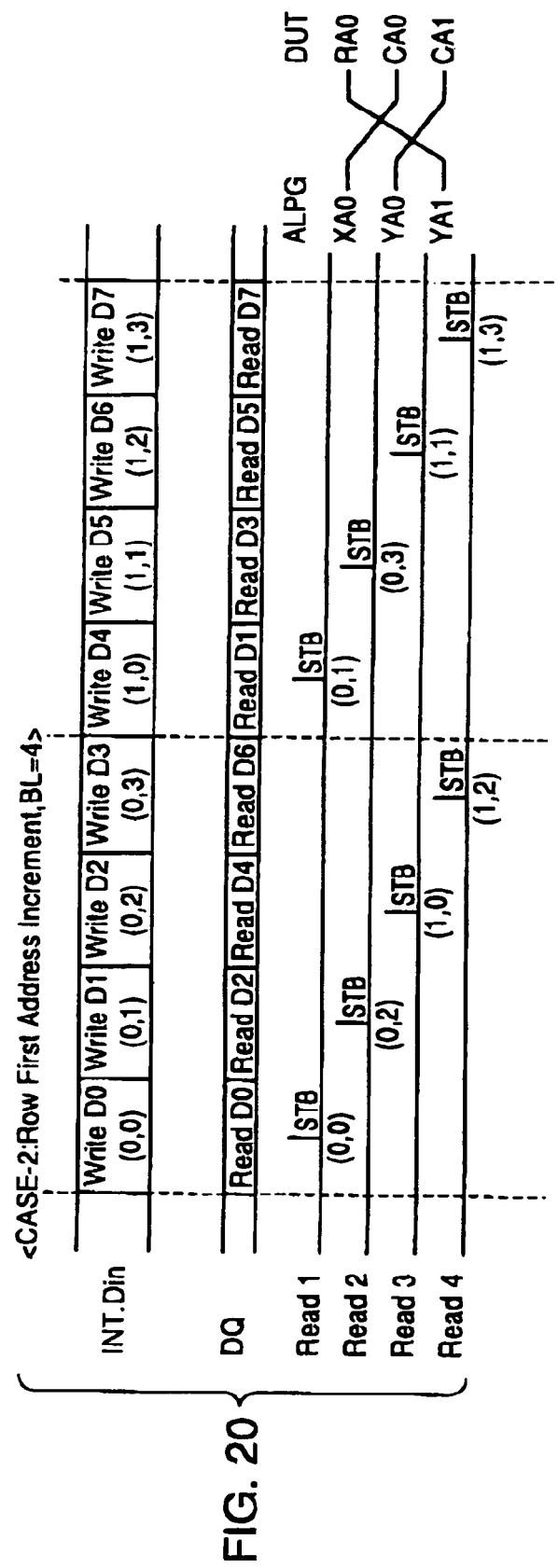
FIG. 20 is a timing chart representing the read out timing of the test result when the row is given priority in the second embodiment.

In the example shown in FIG. 20, scramble is applied among address XA0 in the X direction and addresses YA0 and YA1 in the X direction from ALPG 54 to obtain the DUT row address of RA0 and column address of CA0 and CA1. Accordingly, all the eight data can be read out during eight cycles of tester 182 similar to the case of FIG. 19.

By this process, testing can be carried out at high speed according to the frequency-multiplied dock signal in memory 180 with a built-in self test circuit. Therefore, the repair test of memory cell array 30 can be carried out corresponding to the operating frequency of the product. Also, the time required for testing can be reduced. Data can be output to tester 182 at the low-speed clock signal by which tester 182 operates. By the address scramble function, the order of the data read out in testing corresponds to an order convenient for determination.

Therefore, the repair test of a semiconductor memory device can be carried out more speedily than that of the conventional case.

Figure 21:
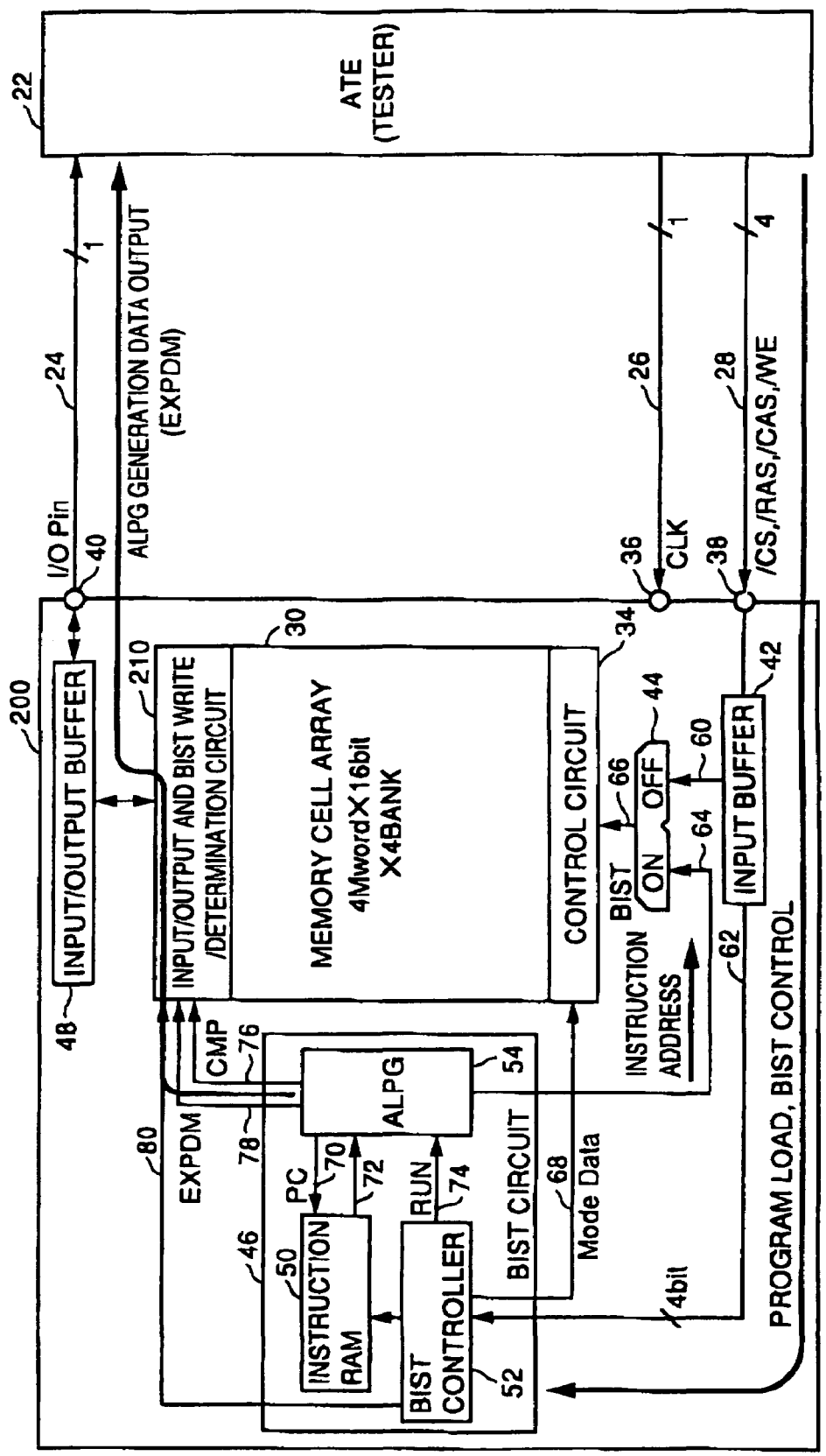
FIG. 21 is a block diagram of a memory 200 with a built-in self test circuit according to a third embodiment of the present invention.

FIG. 21 shows a block diagram of a memory 200 with a built-in self test circuit according to a third embodiment of the present invention. Memory 200 with a built-in self test circuit of the third embodiment is similar to memory 20 with a built-in self test circuit of FIG. 2, provided that input/output and BIST write/determination circuit 32 is replaced with an input/output and BIST write/determination circuit 210 functioning to provide the generated data (EXPDM) from ALPG 54 directly to tester 22.

By providing the generated data (EXPDM) of memory 54 outside, the advantage of allowing confirmation of the operation of memory 200 with a built-in self test circuit from an external source is provided in addition to the advantage of the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of providing data read out from a memory cell array in synchronization with a first clock signal of a first frequency to an external circuit that operates in synchronization with a second clock signal of a second frequency lower than said first frequency, wherein the ratio of said first frequency to said second frequency is a predetermined positive integer, said method comprising the step of: repeating for a plurality, identical to said predetermined positive integer, of times sequential output of a plurality of data items read out from said memory cell array one by one per one cycle of said first clock signal, said plurality of data items constituting a data block repeatedly read out one by one per one cycle of said second clock signal for said plurality of times.

2. The method according to claim 1, further comprising the step of scrambling a read out address of data from said memory cell array by a predetermined manner.

* * * * *